(12) United States Patent
Lee

(10) Patent No.: US 7,705,378 B2
(45) Date of Patent: Apr. 27, 2010

(54) CMOS IMAGE SENSOR AND FABRICATING METHOD THEREOF

(75) Inventor: Chang Eun Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 721 days.

(21) Appl. No.: 11/319,590

(22) Filed: Dec. 29, 2005

(65) Prior Publication Data

US 2006/0145176 A1 Jul. 6, 2006

(30) Foreign Application Priority Data

Dec. 30, 2004 (KR) .................... 10-2004-0117182

(51) Int. Cl.
*H01L 31/062* (2006.01)
*H01L 21/00* (2006.01)
(52) U.S. Cl. .............. 257/292; 257/233; 257/E27.132; 257/E27.133; 257/E27.134; 438/48; 438/65
(58) Field of Classification Search ............... 257/233, 257/292, 27.132, 27.133, 27.134, 434, 435, 257/436, 437; 438/48, 65, 69, 72
See application file for complete search history.

(56) References Cited

U.S. PATENT DOCUMENTS

| 5,396,090 | A  | * | 3/1995 | Nakai ................... 257/233 |
| 6,379,992 | B2 | * | 4/2002 | Jo ....................... 438/70 |
| 6,414,343 | B1 |   | 7/2002 | Kondo et al. |
| 6,632,701 | B2 | * | 10/2003 | Merrill ................ 438/70 |
| 2006/0043515 | A1 | * | 3/2006 | Ford .................... 257/436 |
| 2006/0054939 | A1 | * | 3/2006 | Hsu et al. ............. 257/234 |
| 2006/0086957 | A1 | * | 4/2006 | Kang ................... 257/292 |

FOREIGN PATENT DOCUMENTS

KR 100165376 B1 9/1998

* cited by examiner

*Primary Examiner*—Long K Tran
(74) *Attorney, Agent, or Firm*—McKenna Long & Aldridge LLP

(57) ABSTRACT

A CMOS image sensor and fabricating method thereof can enhance the quality of the image sensor by preventing unnecessary diffused reflection of light by providing an opaque filter layer next to a microlens. The CMOS image sensor includes a photodiode, an insulating interlayer, a metal line, a device protecting layer, a microlens on the device protecting layer and overlapped with the photodiode, and an opaque layer pattern on the device protecting layer next to the microlens.

10 Claims, 3 Drawing Sheets

CMOS IMAGE SENSOR AND FABRICATING METHOD THEREOF

This application claims the benefit of Korean Patent Application No. 10-2004-0117182, filed on Dec. 30, 2004, which is hereby incorporated by reference for all purposes as if fully set forth herein.

BACKGROUND OF THE INVENTION

1. Field of the Invention

The present invention relates to a CMOS image sensor and a fabricating method thereof. Although the present invention is suitable for a wide scope of applications, it is particularly suitable for preventing diffused reflection that occurs due to the presence of metal lines by providing an opaque layer on a device isolation layer between microlenses.

2. Discussion of the Related Art

Generally, an image sensor is a semiconductor device that converts an optic image to an electric signal. In a CCD (charge coupled device) image sensor, a plurality of MOS (metal-oxide-metal) capacitors are arranged close to one another to transfer and store electric charge carriers. In a CMOS (complementary MOS) image sensor, a plurality of MOS transistors corresponding to the number of pixels are fabricated by the CMOS technology using a control circuit and a signal processing circuit as peripheral circuits. Also, a switching system of sequentially detecting outputs using the MOS transistors is adopted.

The CMOS image sensor converts image information of a subject to an electric signal by using signal processing chips including photodiodes. Since an amplifier, an analog/digital (A/D) converter, an internal voltage generator, a timing generator, a digital logic, etc. can be integrated on each of the chips, the CMOS image sensor is advantageous in saving space, power and cost. Moreover, mass production of CMOS image sensors is enabled through a silicon wafer etching process that is cheaper than the fabricating process for CCDs, which includes a more complex process.

Thus, the CMOS image sensor has expanded into application fields such as digital cameras, smart phones, PDAs, notebook computers, security cameras, barcode detectors, toys, etc.

To increase the photosensitivity of the CMOS image sensor, many efforts have been made to increase the fill factor, which indicates a rate of number of pixels of a pixel area within a chip. However, a logic circuit part for signal processing takes up space and therefore limits the fill factor. Hence, a microlens forming technology has been introduced to increase the photosensitivity. A microlens condenses light by diverting a path of the light incident on an area that does not include a photosensing device, such as a photodiode.

An image of a subject may be transferred to the photodiode via the microlens. If a metal line within a device is in the way of a light path, diffused reflection occurs, which degrades image quality.

A method of fabricating a CMOS image sensor according to the related art is explained with reference to the attached drawing as follows.

FIG. 1 is a cross-sectional diagram of a CMOS image sensor according to a related art. Referring to FIG. 1, a first epitaxial layer (not shown) is grown on a semiconductor substrate 10. A red photodiode 11 is formed on the first epitaxial layer. A second epitaxial layer (not shown) is grown on the first epitaxial layer including the red photodiode 11. A green photodiode 13 is formed on the second epitaxial layer. A third epitaxial layer (not shown) is grown on the second epitaxial layer including the green photodiode 13. A blue photodiode 15 is formed on the third epitaxial layer. A trench for field isolation is formed on the third epitaxial layer. An STI (shallow trench isolation) layer 16 is then formed by filling the trench with insulator.

An insulating interlayer 17 is formed on the third epitaxial layer. A first metal layer (not shown) is formed on the insulating interlayer 17, and metal lines 23 are then formed by patterning the first metal layer. The process of forming the insulating interlayer 17 and the metal lines 23 is repeated several times to stack necessary metal lines 23. A device protecting layer 20, which may be made of nitride, is formed on the stacked insulating interlayer 17 to protect a device from moisture or physical shock. A microlens 22 is then formed on the device protecting layer 20.

In fabricating the CMOS image sensor according to the related art, if the metal line lies on a path of light having passed through the microlens 22, diffused reflection is caused and degrades image quality.

The related art method has the following problem. Since the device isolation layer, which may be nitride, is formed between the microlenses and is transparent, the diffused reflection degrades the image quality when the metal line lies in a path of the incident light via the device isolation layer.

SUMMARY OF THE INVENTION

Accordingly, the present invention is directed to a CMOS image sensor and fabricating method thereof that substantially obviate one or more problems due to limitations and disadvantages of the related art.

An advantage of the present invention is to provide a CMOS image sensor and fabricating method thereof, by which the quality of the image sensor can be enhanced by preventing unnecessary diffused reflection of light by providing an opaque filter layer next to a microlens.

Additional features and advantages of the invention will be set forth in the description which follows, and will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, a CMOS image sensor includes a photodiode in a semiconductor substrate, an insulating interlayer on the semiconductor substrate including the photodiode, a metal line embedded within the insulating interlayer, a device protecting layer on the insulating interlayer, a microlens on the device protecting layer, wherein the microlens overlaps the photodiode, and an opaque layer pattern on the device protecting layer adjacent the microlens.

In another aspect of the present invention, a method of fabricating a CMOS image sensor includes the steps of forming a photodiode in a semiconductor substrate, forming a first insulating interlayer on the semiconductor substrate including the photodiode, forming a metal line on the first insulating interlayer, forming a second insulating interlayer on the first insulating interlayer including the metal line, forming a device protecting layer on the second insulating interlayer, forming a microlens on the device protecting layer to be overlapped with the photodiode, and forming an opaque layer pattern on the device protecting layer adjacent the microlens.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principle of the invention. In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or similar parts.

Figure 1:
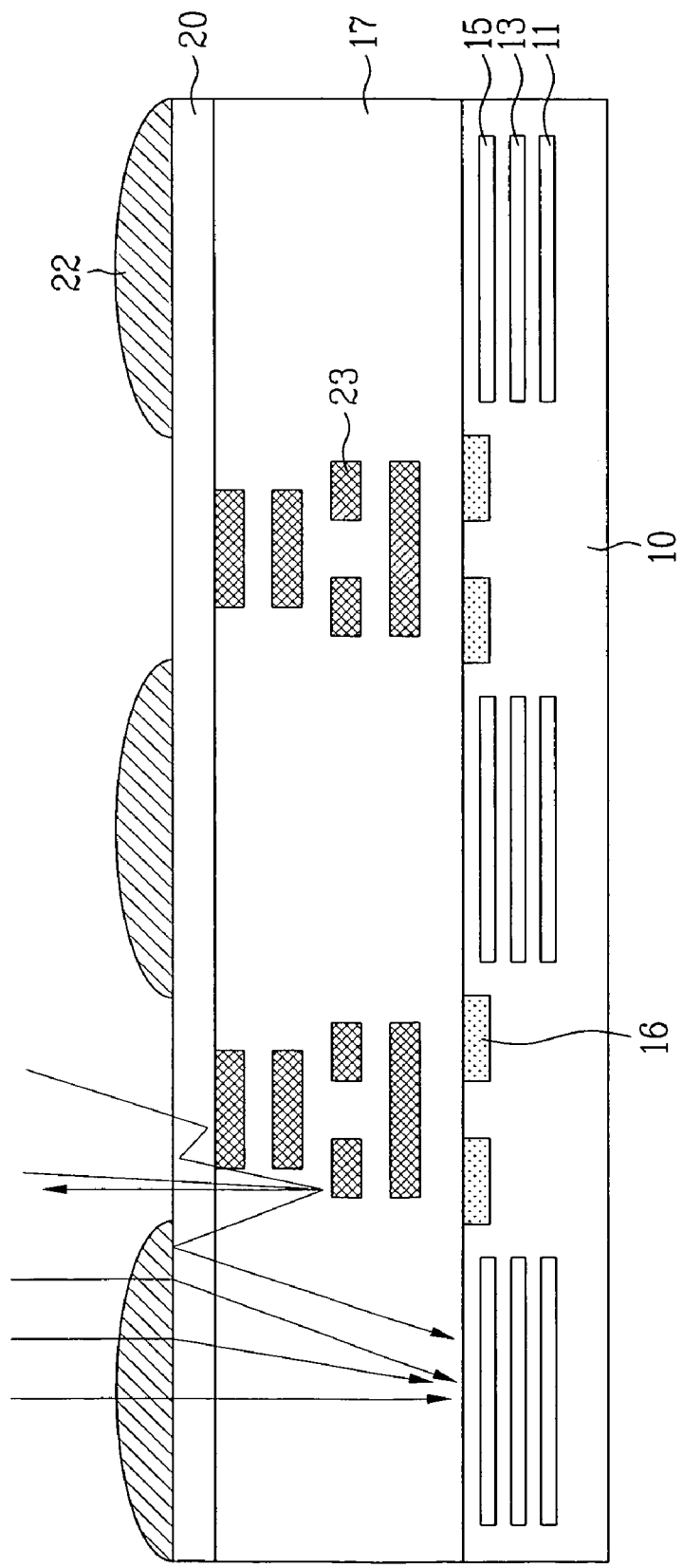
FIG. 1 is a cross-sectional diagram of a CMOS image sensor according to a related art.
Figure 2A:
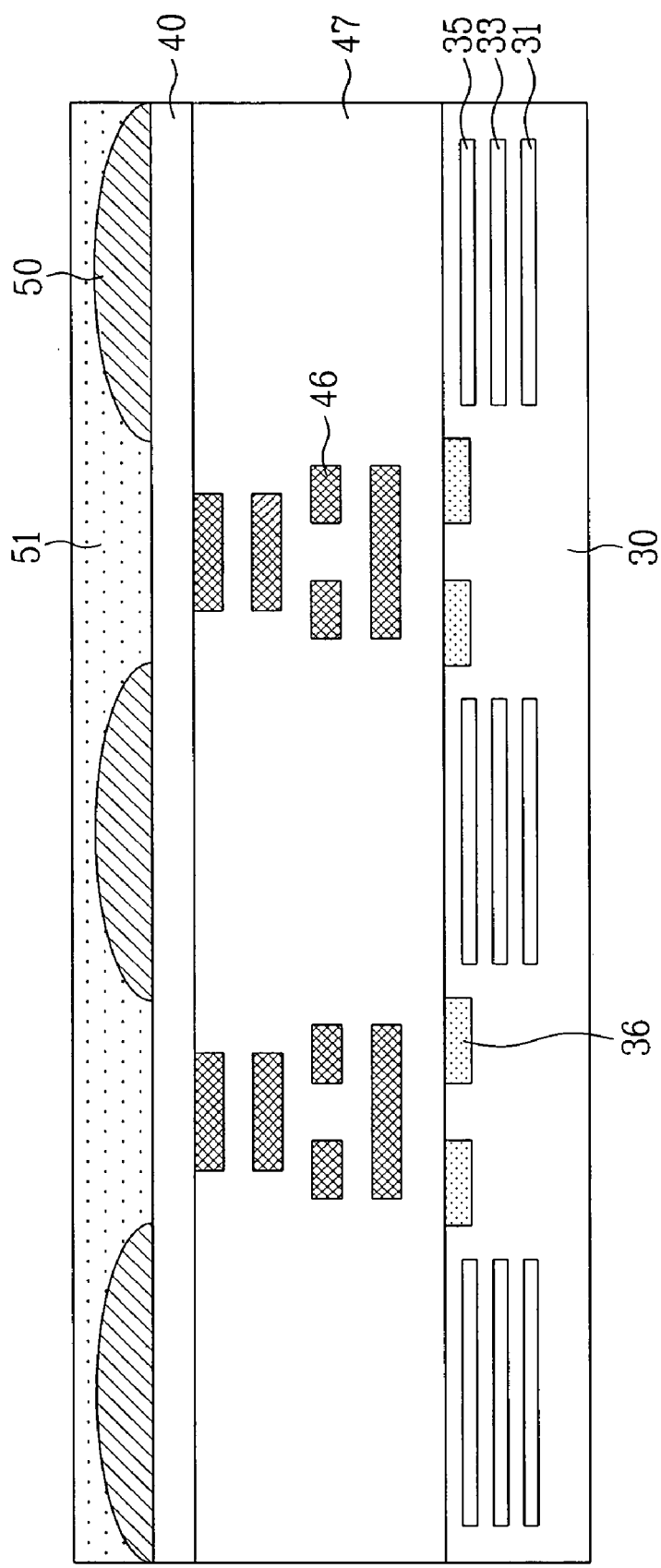
FIG. 2A and FIG. 2B are cross-sectional diagrams of a CMOS image sensor fabricated by a method of fabricating a CMOS image sensor according to the present invention.

Referring to FIG. 2, a first epitaxial layer (not shown) is grown on a semiconductor substrate 30. A red photodiode 31 is formed on the first epitaxial layer. A second epitaxial layer (not shown) is grown on the first epitaxial layer including the red photodiode 31. A green photodiode 33 is formed on the second epitaxial layer. A third epitaxial layer (not shown) is grown on the second epitaxial layer including the green photodiode 33. A blue photodiode 35 is formed on the third epitaxial layer. A trench for field isolation is formed on the third epitaxial layer. An STI (shallow trench isolation) layer 36 is then formed by filling the trench with insulator.

An insulating interlayer 47 is formed on the third epitaxial layer including the blue photodiode 35 and the STI layer 36. A first metal layer (not shown) is formed on the insulating interlayer 47, and metal lines 46 are then formed by patterning the first metal layer. The process of forming the insulating interlayer 47 and the metal lines 46 is repeated several times to stack necessary metal lines 46. The metal lines 46 should be formed on the insulating interlayer to not be overlapped with the photodiodes 31, 33 and 35. Hence, light incident on the photodiodes 31, 33 and 35 is not affected by the metal lines 46.

A device protecting layer 40, which may be nitride, is formed on the stacked insulating interlayer 47 to protect a device from moisture or physical shock. The device protecting layer 40 may then be planarized by chemical mechanical polishing (CMP).

A photoresist layer (not shown) is coated on the planarized device protecting layer 40. Exposure and development are performed on the photoresist layer to form a microlens pattern (not shown) on the device protecting layer 40 that overlaps with the photodiodes. Reflowing is performed on the microlens pattern by annealing to form hemispherical microlenses 50.

Then, an opaque layer 51 is formed on the device isolation layer 40 including the microlens 50.

Figure 2B:
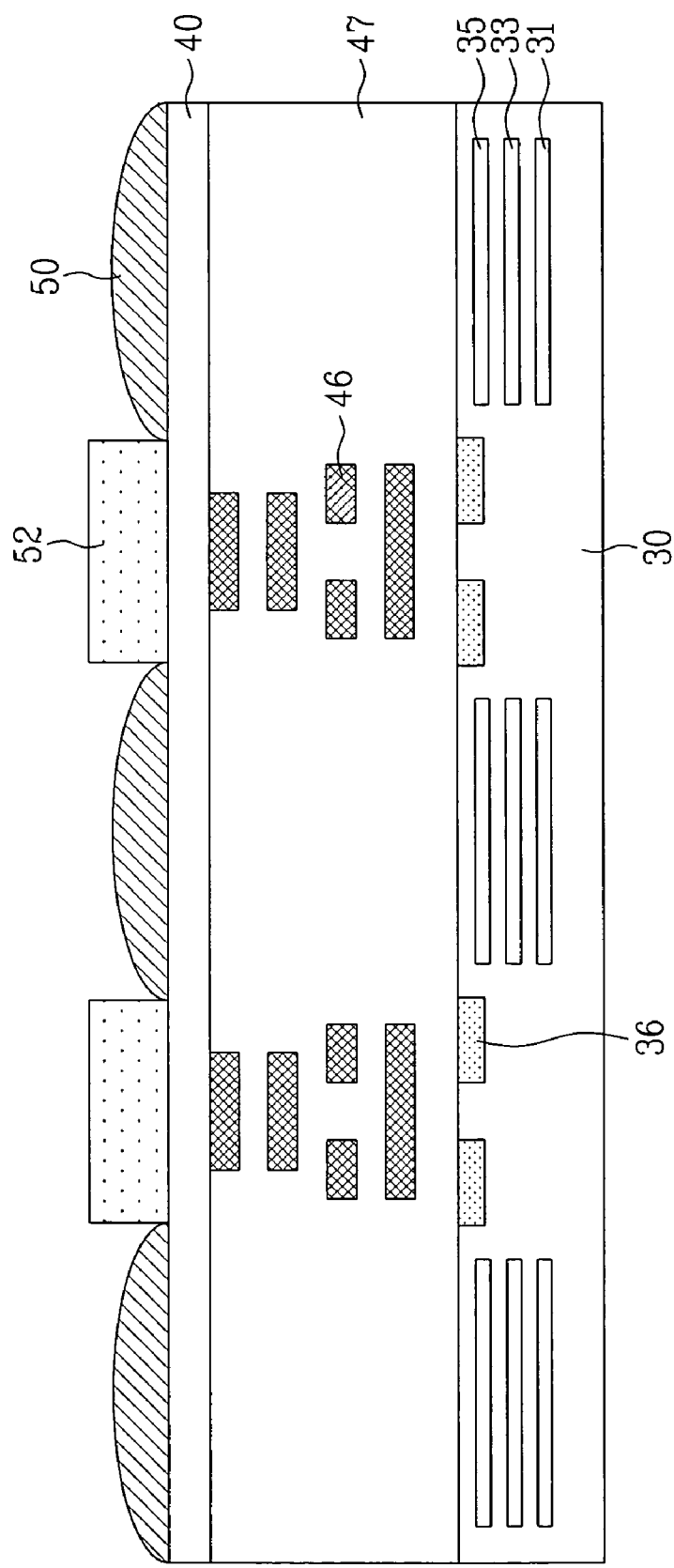

Referring to FIG. 2B, the opaque layer 51 is patterned to form an opaque layer pattern 52 remaining on the device protecting layer 40 overlapped with the metal lines 46.

Accordingly, the present invention provides the following effect.

By providing the opaque layer pattern between the microlenses, i.e., on the device protecting layer overlapped with the metal lines, light interference generated from diffused reflection, caused by light reflected by the metal lines via the microlens, can be eliminated. Hence, the image quality of the device can be enhanced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A CMOS image sensor comprising:
   a photodiode in a semiconductor substrate;
   an insulating interlayer on the semiconductor substrate including the photodiode;
   a metal line embedded within the insulating interlayer;
   a device protecting layer on the insulating interlayer;
   a microlens on the device protecting layer, wherein the microlens overlaps the photodiode; and
   an opaque layer pattern only on the device protecting layer between the microlens, wherein the opaque layer pattern overlaps the metal line.

2. The CMOS image sensor of claim 1, wherein the metal line is embedded within the insulating interlayer and is not overlapped with the photodiode.

3. The CMOS image sensor of claim 2, wherein the opaque layer pattern lies on the device protecting layer to be overlapped with the metal line.

4. The CMOS image sensor of claim 1, wherein the device protecting layer comprises a nitride layer.

5. The CMOS image sensor of claim 1, wherein the photodiode comprises red, green and blue photodiodes vertically stacked within the semiconductor substrate.

6. A method of fabricating a CMOS image sensor, comprising the steps of:
   forming a photodiode in a semiconductor substrate;
   forming a first insulating interlayer on the semiconductor substrate including the photodiode;
   forming a metal line on the first insulating interlayer;
   forming a second insulating interlayer on the first insulating interlayer including the metal line;
   forming a device protecting layer on the second insulating interlayer;
   forming a microlens on the device protecting layer to be overlapped with the photodiode; and
   forming an opaque layer pattern only on the device protecting layer between the microlens, wherein the opague layer pattern overlaps the metal line.

7. The method of claim 6, wherein the metal line is formed on the first insulating interlayer and is not overlapped with the photodiode.

8. The method of claim 7, wherein the opaque layer pattern is formed on the device protecting layer and is overlapped with the metal line.

9. The method of claim 6, wherein the device protecting layer is formed of a nitride layer.

10. The method of claim 6, wherein the step of forming the photodiode comprises the steps of:
    forming a first epitaxial layer in the semiconductor substrate;
    forming a red photodiode on the first epitaxial layer;
    forming a second epitaxial layer on the first epitaxial layer including the red photodiode;
    forming a green photodiode on the second epitaxial layer;
    forming a third epitaxial layer on the second epitaxial layer including the green photodiode; and
    forming a blue photodiode on the third epitaxial layer.

* * * * *